United States Patent
Abe

(10) Patent No.: US 10,245,827 B2
(45) Date of Patent: Apr. 2, 2019

(54) LIQUID EJECTING DEVICE, DRIVER CIRCUIT, AND HEAD UNIT

(71) Applicant: Seiko Epson Corporation, Tokyo (JP)

(72) Inventor: Akira Abe, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/556,424

(22) PCT Filed: Mar. 14, 2016

(86) PCT No.: PCT/JP2016/001431
§ 371 (c)(1),
(2) Date: Sep. 7, 2017

(87) PCT Pub. No.: WO2016/152079
PCT Pub. Date: Sep. 29, 2016

(65) Prior Publication Data
US 2018/0104950 A1 Apr. 19, 2018

(30) Foreign Application Priority Data

Mar. 20, 2015 (JP) .................................. 2015-058456
Mar. 20, 2015 (JP) .................................. 2015-058458

(51) Int. Cl.
*B41J 2/045* (2006.01)
*H03K 5/24* (2006.01)

(52) U.S. Cl.
CPC ......... *B41J 2/04541* (2013.01); *B41J 2/0455* (2013.01); *B41J 2/04581* (2013.01);
(Continued)

(58) Field of Classification Search
USPC .............................................. 347/5, 9, 10, 12
See application file for complete search history.

(56) References Cited

U.S. PATENT DOCUMENTS

| 4,730,168 A | 3/1988 | Senderowicz et al. |
| 5,488,322 A | 1/1996 | Kaplinsky |

(Continued)

FOREIGN PATENT DOCUMENTS

| EP | 0929193 A2 | 7/1999 |
| JP | H07-142939 A | 6/1995 |

(Continued)

*Primary Examiner* — Lam S Nguyen
(74) *Attorney, Agent, or Firm* — Harness, Dickey & Pierce, P.L.C.

(57) ABSTRACT

A liquid ejecting device includes: an ejection section having a piezoelectric element that ejects liquid by being displaced upon application of a drive signal; a comparator having a first comparator section and a second comparator section, receiving an input signal and the drive signal, and outputting first and second control signals; and a transistor pair having a first transistor controlled with the first control signal and a second transistor controlled with the second control signal, and outputting the drive signal, the first comparator section comparing first and second comparison signals and outputting the first control signal, the first comparison signal being obtained by offsetting one of the input signal and the drive signal, the second comparator section comparing third and fourth comparison signals and outputting the second control signal, and the third comparison signal being obtained by offsetting one of the input signal and the drive signal.

9 Claims, 11 Drawing Sheets

(52) U.S. Cl.
CPC ....... *B41J 2/04593* (2013.01); *B41J 2/04596* (2013.01); *H03K 5/2481* (2013.01)

(56) References Cited

U.S. PATENT DOCUMENTS

| | | | |
|---|---|---|---|
| 5,959,475 | A | 9/1999 | Zomorrodi |
| 6,582,043 | B2 * | 6/2003 | Ishizaki ............... B41J 2/04541 347/12 |
| 2008/0211847 | A1 | 9/2008 | Shamoun |
| 2009/0206888 | A1 | 8/2009 | Kitazawa et al. |
| 2012/0182339 | A1 * | 7/2012 | Oshima ................ B41J 2/04541 347/10 |

FOREIGN PATENT DOCUMENTS

| | | |
|---|---|---|
| JP | 2009-190287 A | 8/2009 |
| JP | 2010-114711 A | 5/2010 |

* cited by examiner

[Fig. 1]
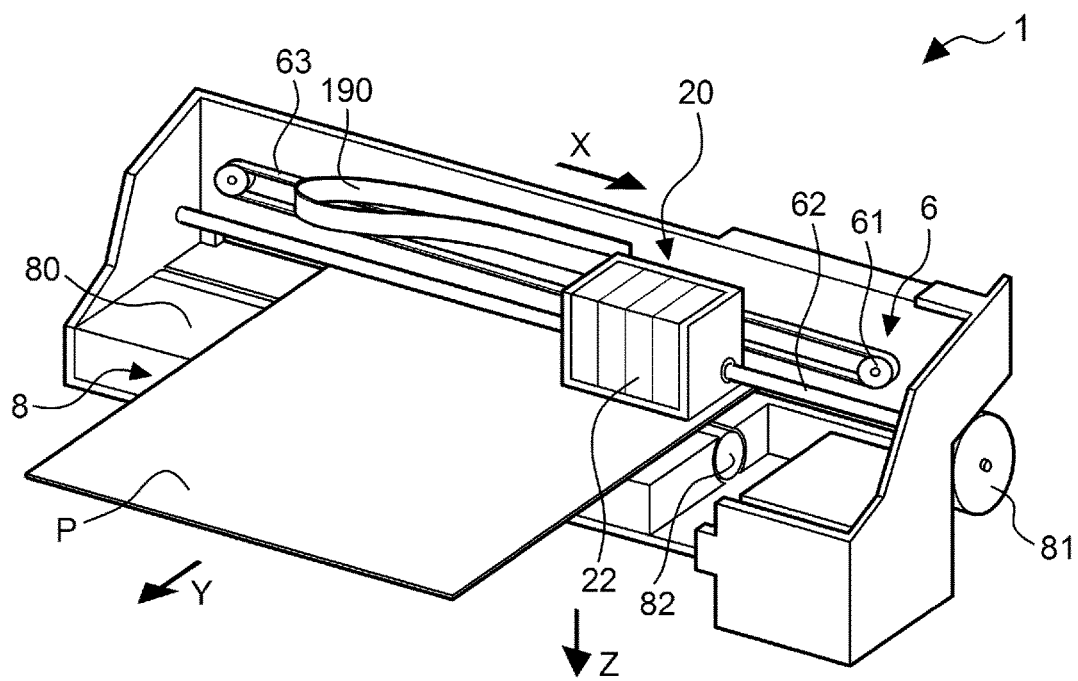
[Fig. 2A]
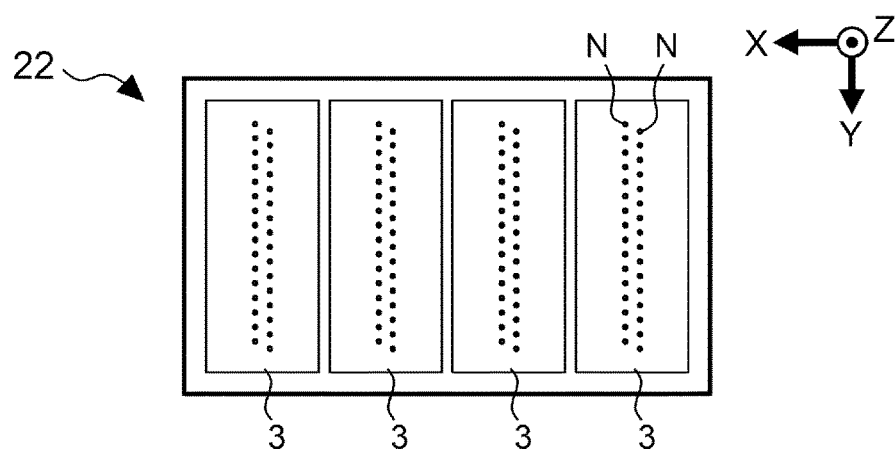

[Fig. 2B]
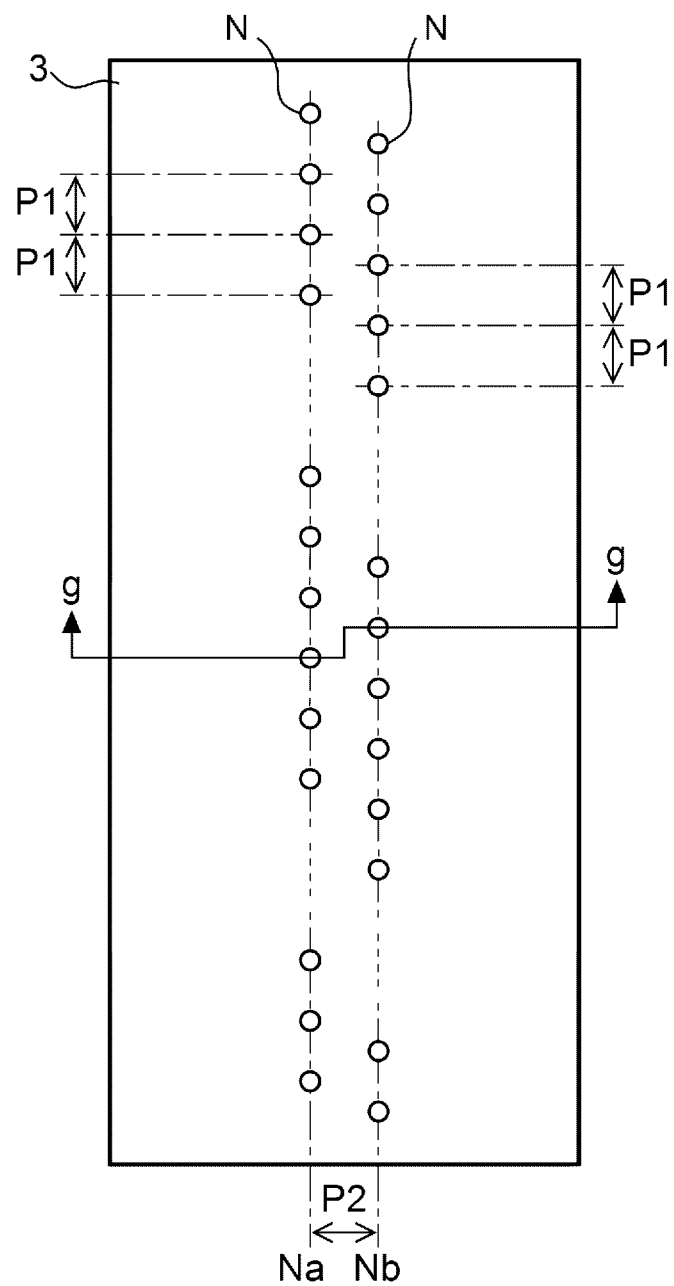

[Fig. 3]
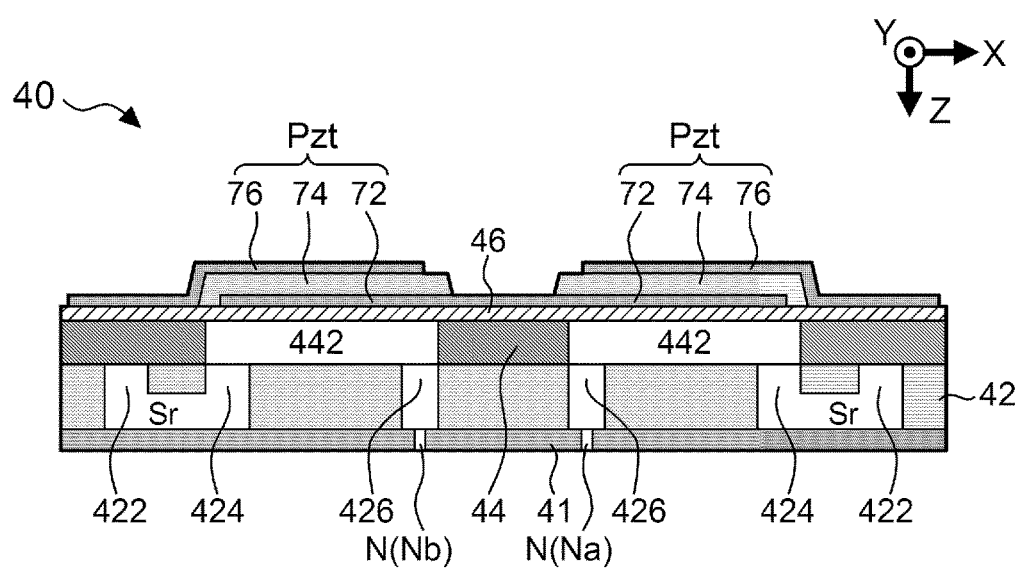

[Fig. 4]
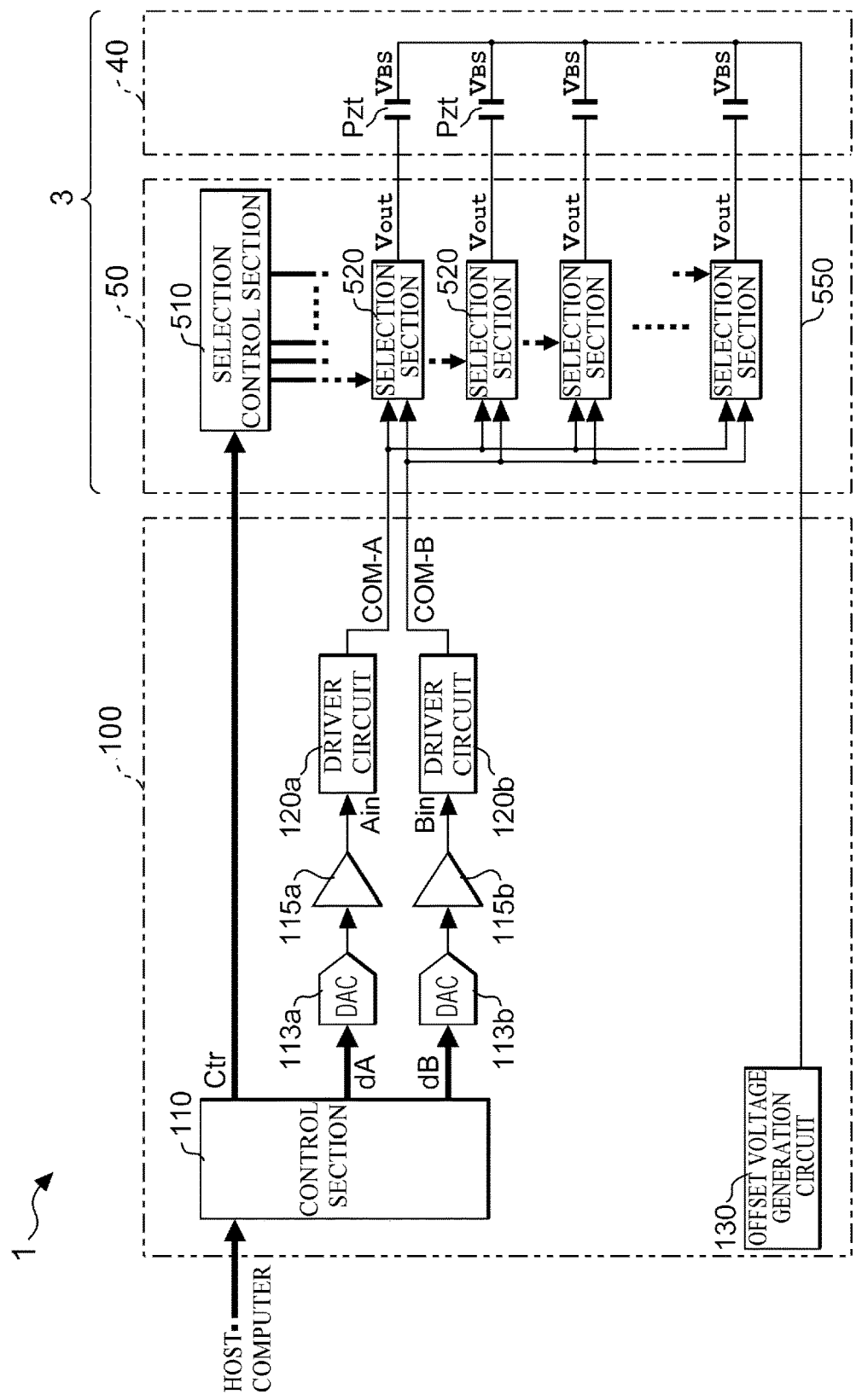

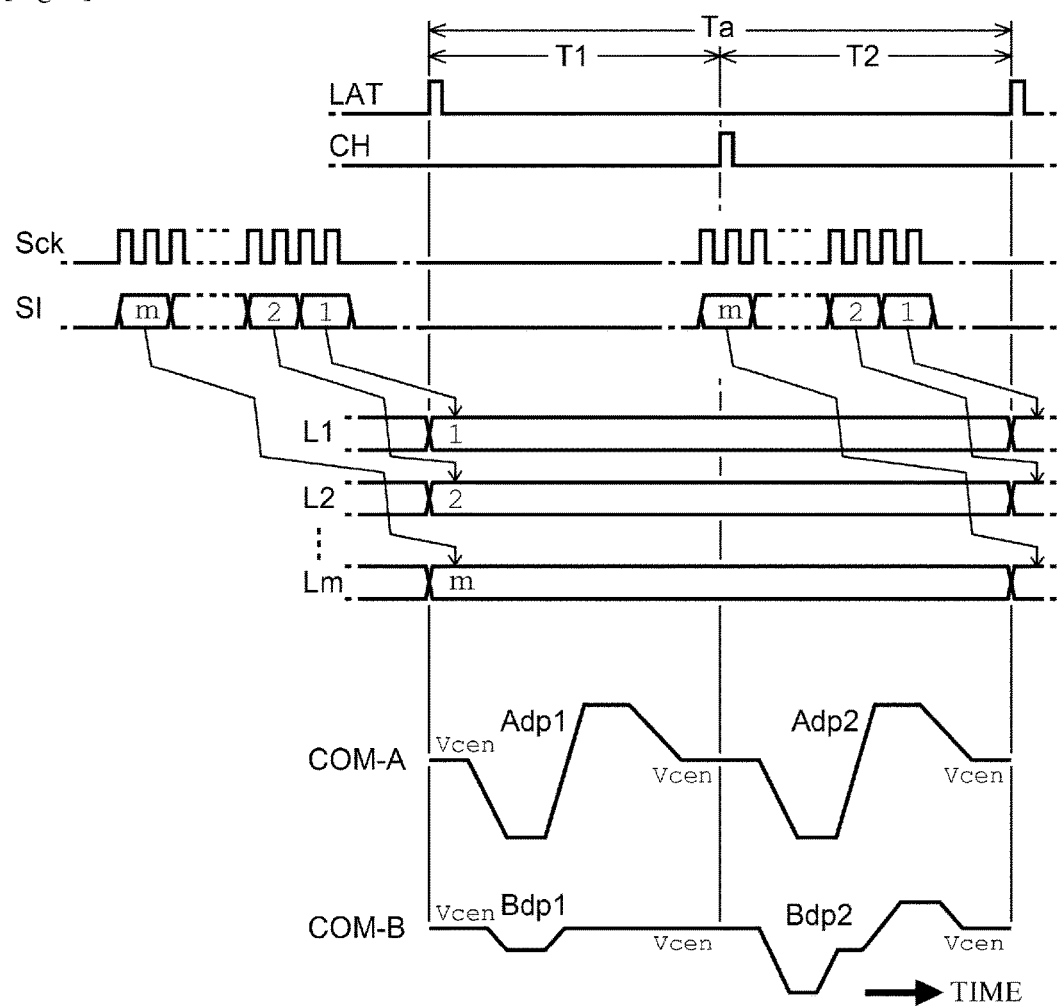
[Fig. 5]

[Fig. 6]
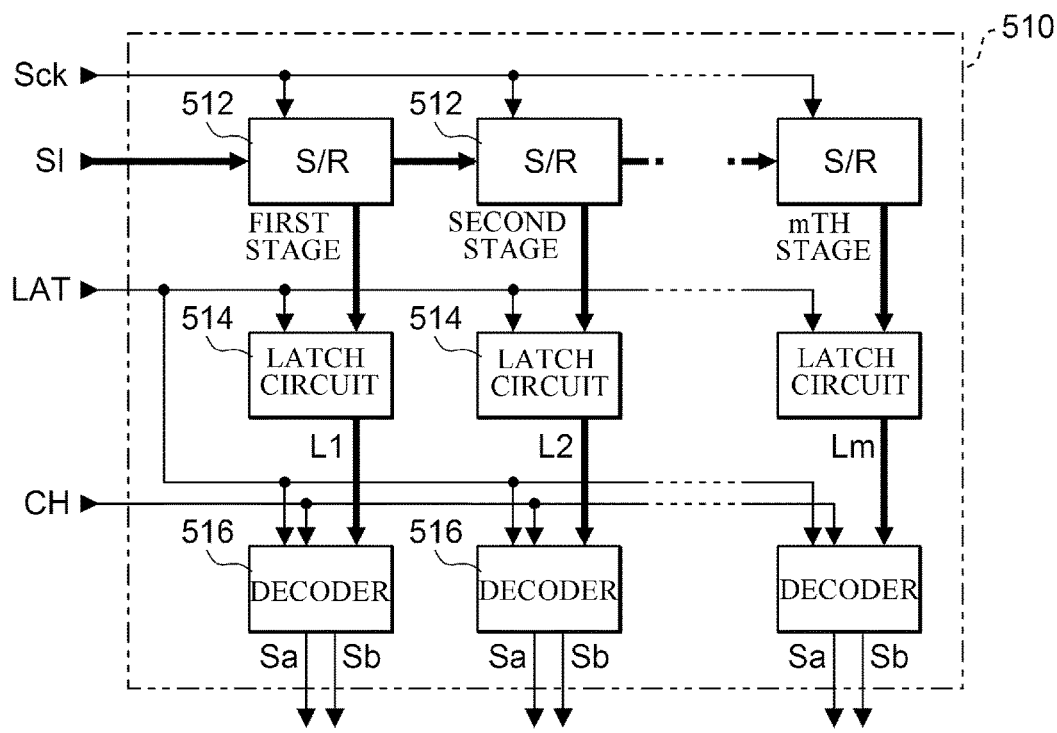
[Fig. 7]

[Fig. 8]
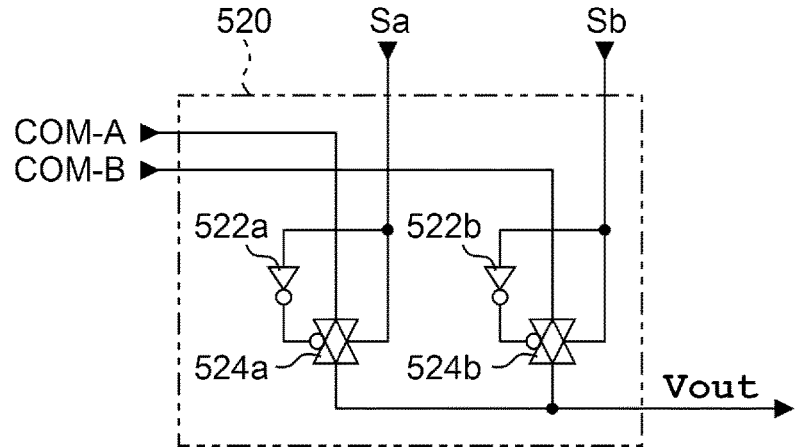
[Fig. 9]
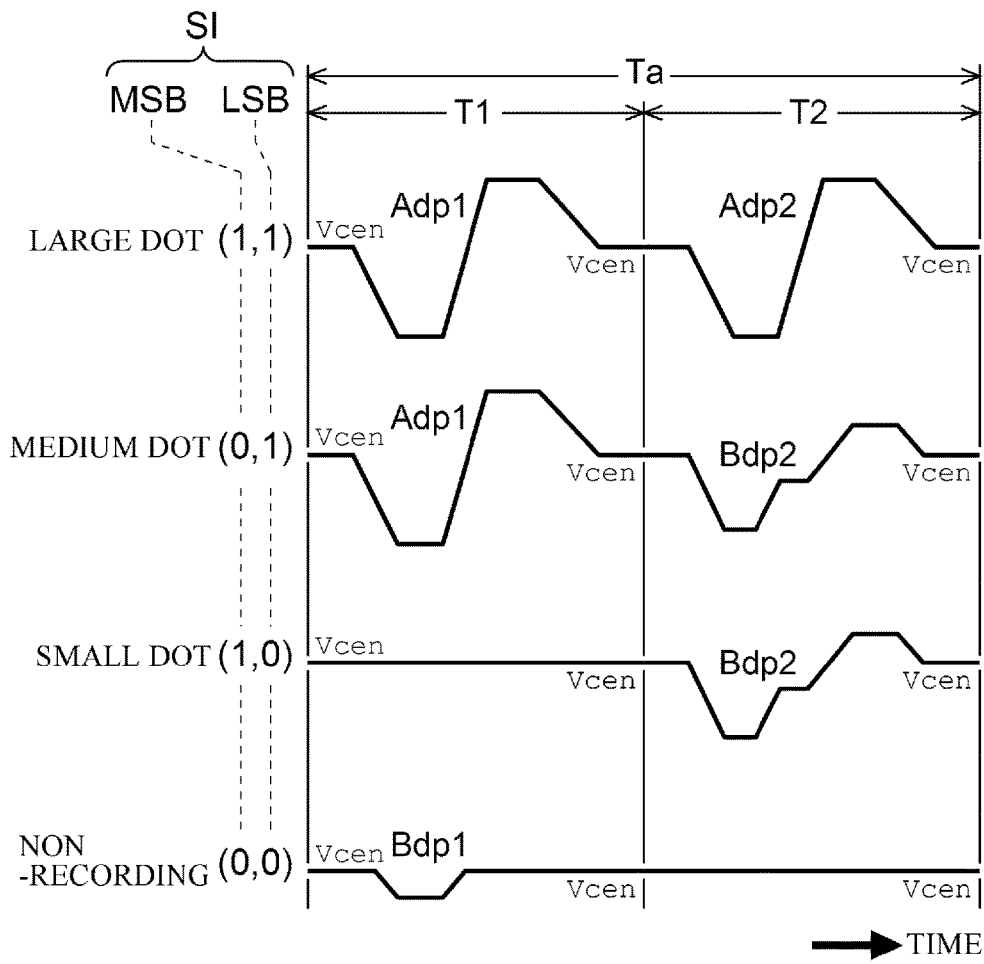

[Fig. 10]
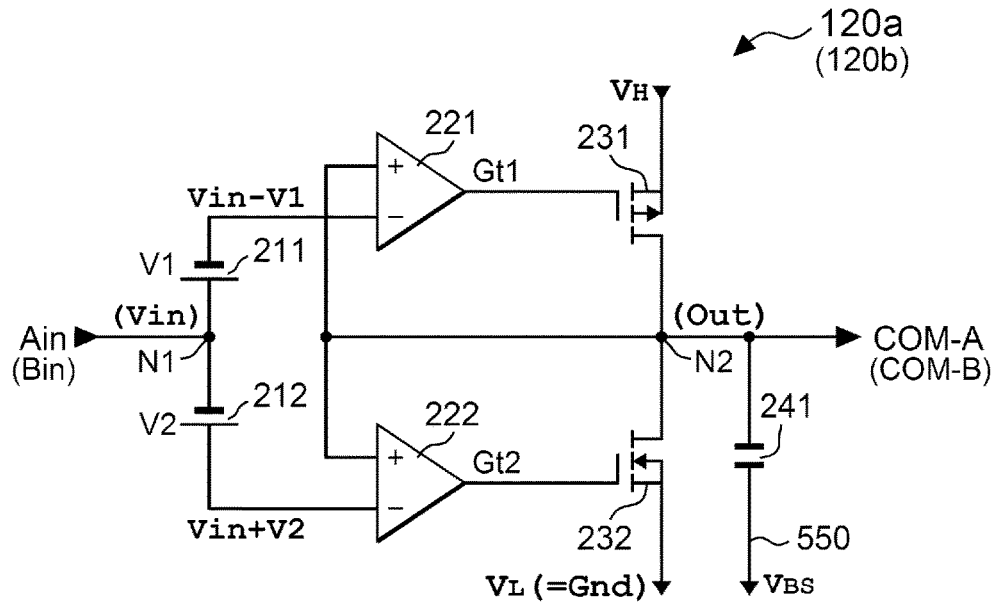
[Fig. 11]
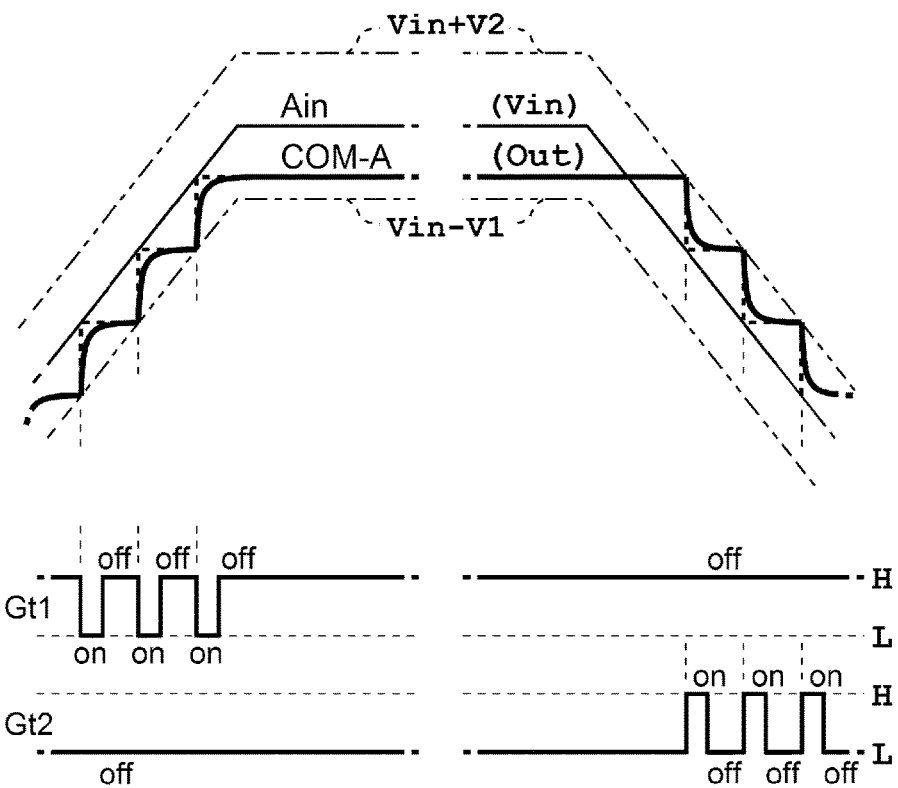

[Fig. 12]
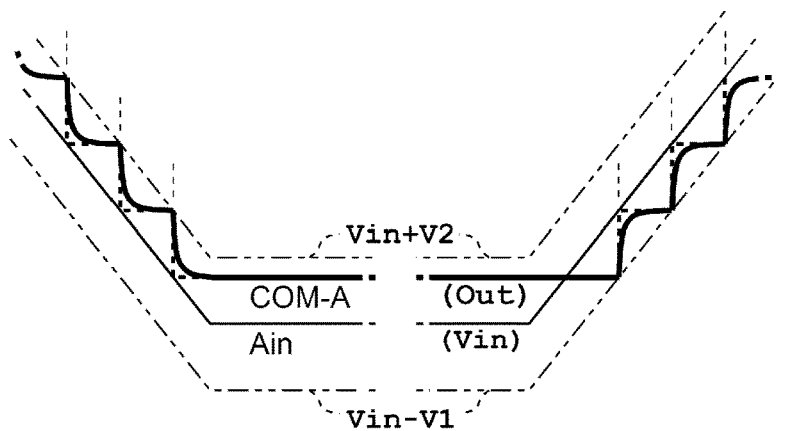
[Fig. 13]
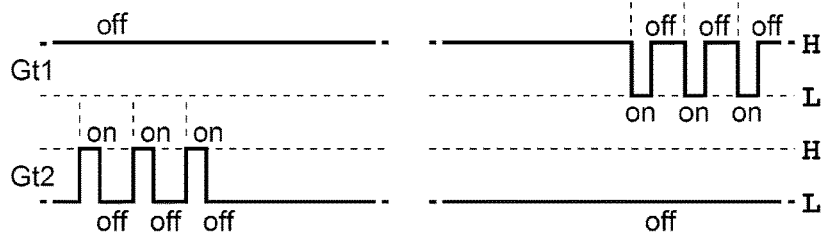
[Fig. 14]
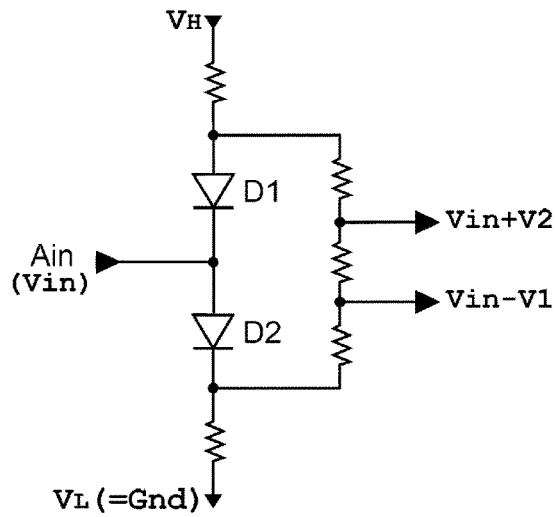

[Fig. 15]
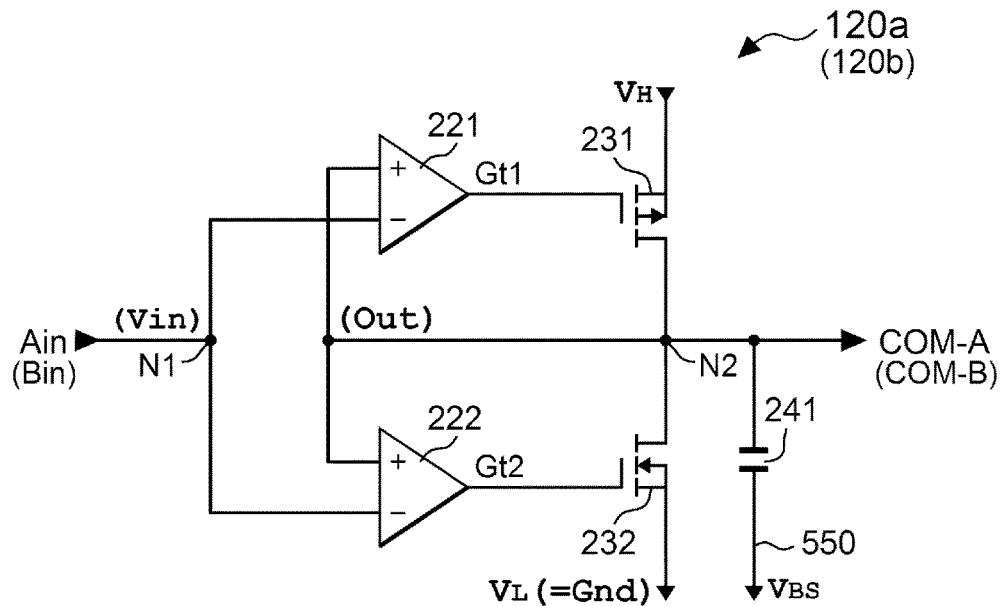
[Fig. 16A]
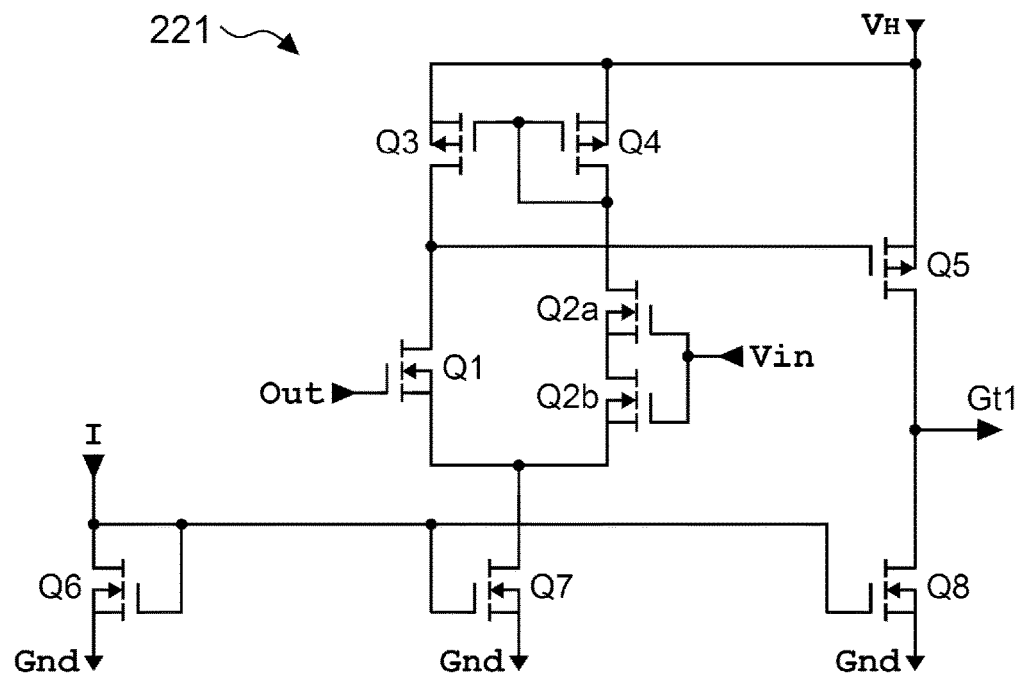

[Fig. 16B]
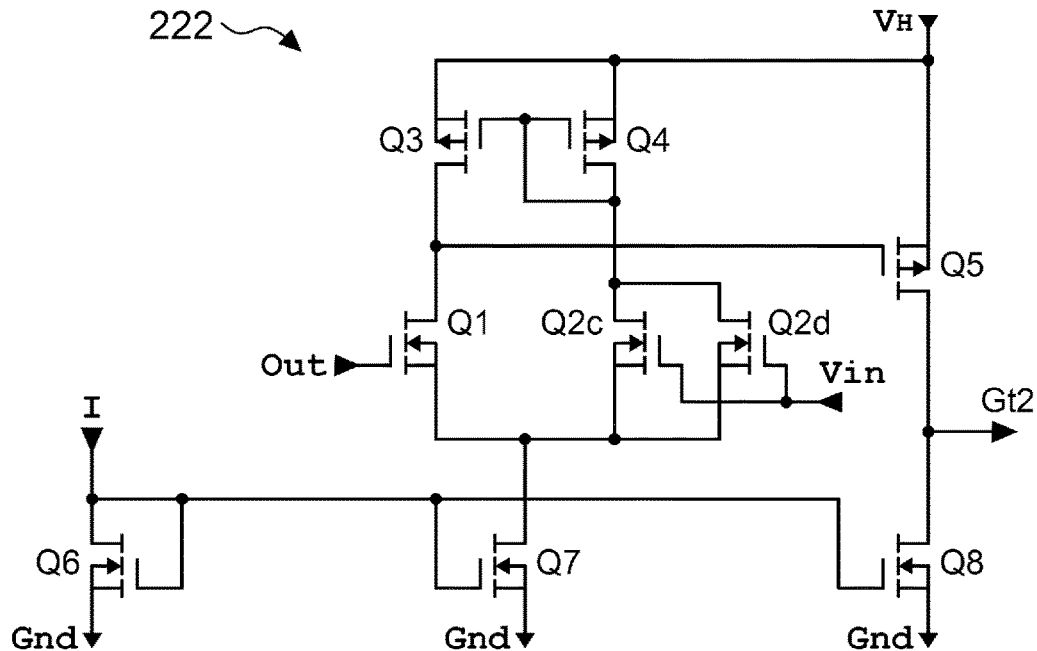
[Fig. 17]
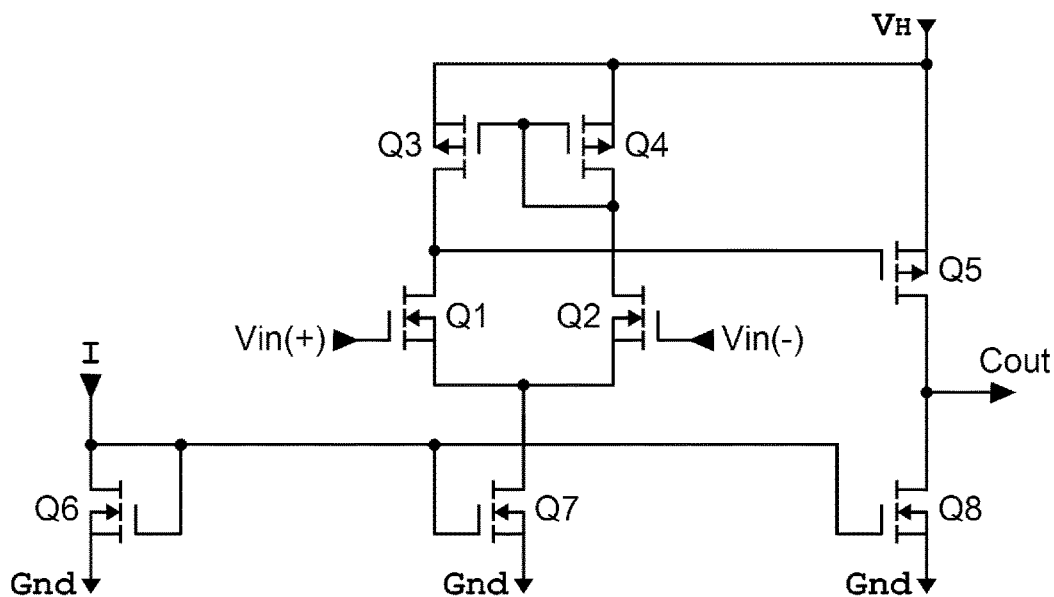

LIQUID EJECTING DEVICE, DRIVER CIRCUIT, AND HEAD UNIT

BACKGROUND

Technical Field

The present invention relates to a liquid ejecting device, a driver circuit, and a head unit.

Background Art

An inkjet printer that ejects an ink to print an image or a document may utilize a piezoelectric element (piezo element). The piezoelectric element is provided to a head unit corresponding to each of a plurality of nozzles, and driven according to a drive signal so that a predetermined amount of ink (liquid) is ejected from each nozzle at a predetermined timing to form a dot. Since the piezoelectric element electrically serves as a capacitive load in the same manner as a capacitor, it is necessary to supply a sufficient amount of current in order to operate the piezoelectric element that corresponds to each nozzle.

Therefore, a source drive signal is normally amplified by an amplifier circuit, and supplied to the head unit as the drive signal to drive the piezoelectric element. The amplifier circuit may be configured to perform a class-AB current amplification operation or the like on the source drive signal (linear amplification operation (see JP-A-2009-190287). However, since the linear amplification operation consumes a large amount of electric power, and has poor energy efficiency, an amplifier circuit that performs a class-D amplification operation has been proposed in recent years (see JP-A-2010-114711). The class-D amplification operation is designed to subject the input signal to pulse width modulation or pulse density modulation, operate (switch) a high-side transistor and a low-side transistor that are inserted in series between power supply voltages according to the modulated signal, and filter (demodulate) the resulting output signal with a low-pass filter to amplify the input signal.

The class-D amplification operation achieves high energy efficiency as compared with the linear amplification operation, but a considerable amount of electric power is consumed by the low-pass filter. Therefore, it is desirable to implement a further improvement in terms of power consumption.

An object of several aspects of the invention is to provide a liquid ejecting device, a driver circuit, and a head unit that achieve a reduction in power consumption.

SUMMARY

According to one aspect of the invention, a liquid ejecting device that achieves the above object includes:
an ejection section that includes a piezoelectric element that is displaced upon application of a drive signal, and ejects a liquid upon displacement of the piezoelectric element;
a comparator unit that includes a first comparator section and a second comparator section, receives an input signal and the drive signal, and outputs a first control signal and a second control signal; and
a transistor pair that includes a first transistor that is controlled based on the first control signal and a second transistor that is controlled based on the second control signal, and outputs the drive signal,
the first comparator section comparing a first comparison signal and a second comparison signal and outputting the first control signal,
the first comparison signal being a signal obtained by offsetting one of the input signal and the drive signal,
the second comparator section comparing a third comparison signal and a fourth comparison signal and outputting the second control signal, and
the third comparison signal being a signal obtained by offsetting one of the input signal and the drive signal.

According to the liquid ejecting device, since it is unnecessary to provide a low-pass filter (i.e., electric power is not consumed by a low-pass filter), it is possible to reduce power consumption as compared with the case of utilizing the class-D amplification operation.

The liquid ejecting device may be configured so that the second comparison signal is a signal obtained by offsetting the other of the input signal and the drive signal by a voltage including 0 V, and the fourth comparison signal is a signal obtained by offsetting the other of the input signal and the drive signal by a voltage including 0 V.

The liquid ejecting device is preferably configured so that each of the first transistor and the second transistor is a field-effect transistor.

The liquid ejecting device may further include a first offset section that lowers the input signal by a first voltage, or raises the drive signal by the first voltage, and a second offset section that raises the input signal by a second voltage, or lowers the drive signal by the second voltage.

The liquid ejecting device may be configured so that the first comparator section sets the first control signal to be a signal that causes the first transistor to be turned ON when a voltage of the drive signal is lower than a voltage obtained by subtracting the first voltage from a voltage of the input signal, and the second comparator section sets the second control signal to be a signal that causes the second transistor to be turned ON when the voltage of the drive signal is equal to or higher than a voltage obtained by adding the second voltage to the voltage of the input signal.

According to this configuration, the first transistor and the second transistor are turned OFF when the voltage of the drive signal is equal to or higher than the voltage obtained by subtracting the first voltage from the voltage of the input signal, and is lower than the voltage obtained by adding the second voltage to the voltage of the input signal.

The liquid ejecting device may be configured so that the first comparator section includes a first differential pair that includes a third transistor and a fourth transistor, the input signal being input to a gate of the third transistor, and the drive signal being input to a gate of the fourth transistor, the second comparator section includes a second differential pair that includes a fifth transistor and a sixth transistor, the input signal being input to a gate of the fifth transistor, and the drive signal being input to a gate of the sixth transistor, the third transistor and the fourth transistor differ in characteristics, and the fourth transistor and the fifth transistor differ in characteristics. More specifically, the transistors that make a differential pair may be designed to differ in the channel size (width or length), the doping amount, the connection configuration (series or parallel), the number of transistors connected, a combination thereof, or the like.

The liquid ejecting device may be configured so that the first comparator section sets the first control signal to be a signal that causes the first transistor to be turned ON when a voltage of the drive signal is lower than a voltage obtained by subtracting a first voltage from a voltage of the input signal, and the second comparator section sets the second control signal to be a signal that causes the second transistor to be turned ON when the voltage of the drive signal is equal to or higher than a voltage obtained by adding a second voltage to the voltage of the input signal. According to this configuration, the first transistor and the second transistor are turned OFF when the voltage of the drive signal is equal to or higher than the voltage obtained by subtracting the first voltage from the voltage of the input signal, and is lower than the voltage obtained by adding the second voltage to the voltage of the input signal.

The liquid ejecting device is preferably configured so that the input signal is a signal obtained by performing a voltage amplification operation on a source drive signal that is a source of the drive signal.

Note that the term "liquid ejecting device" used herein refers to a device that ejects a liquid. The liquid ejecting device may be a printer, a three-dimensional printer (3D printer), a device (printer) that dyes cloth, or the like.

The invention may be implemented in various forms or configurations other than a liquid ejecting device. For example, the invention may be implemented in the form of a driver circuit that drives a capacitive load such as a piezoelectric element, a head unit that is provided to a liquid ejecting device, and the like.

BRIEF DESCRIPTION OF DRAWINGS

FIG. 1 illustrates a schematic configuration of a printer according to the first embodiment.

FIG. 2A illustrates the nozzle arrangement and the like of a head unit.

FIG. 2B illustrates the nozzle arrangement and the like of a head unit.

FIG. 3 is a cross-sectional view illustrating the configuration of the main part of a head unit.

FIG. 4 illustrates the electrical configuration of a printer.

FIG. 5 illustrates the waveform of a drive signal and the like.

FIG. 6 illustrates the configuration of a selection control section.

FIG. 7 illustrates the decoding results of a decoder.

FIG. 8 illustrates the configuration of a selection section.

FIG. 9 illustrates a drive signal that is selected by a selection section and supplied to a piezoelectric element.

FIG. 10 illustrates the configuration of a driver circuit.

FIG. 11 illustrates the operation of a driver circuit.

FIG. 12 illustrates the operation of a driver circuit.

FIG. 13 illustrates the operation of a transistor with the relationship between an input signal and an output signal.

FIG. 14 illustrates another example of a first offset section and a second offset section.

FIG. 15 illustrates the configuration of a driver circuit included in a printer (second embodiment).

FIG. 16A illustrates the configuration of a comparator 221 included in a driver circuit.

FIG. 16B illustrates the configuration of a comparator 222 included in a driver circuit.

FIG. 17 illustrates the configuration of a normal comparator.

DETAILED DESCRIPTION

Exemplary embodiments of the invention are described below with reference to the drawings taking a printer as an example.

First Embodiment

FIG. 1 illustrates a perspective view of a schematic configuration of a printer according to the first embodiment.

A printer 1 is one type of a liquid ejecting device that forms ink dots on a medium P (e.g., paper) by ejecting an ink (i.e., liquid) to print an image (including a character, a figure, and the like).

As illustrated in FIG. 1, the printer 1 includes a moving mechanism 6 that moves (reciprocates) a carriage 20 in the main scan direction (X-direction).

The moving mechanism 6 includes a carriage motor 61 that moves the carriage 20, a carriage guide shaft 62 that is secured on each end, and a timing belt 63 that extends almost parallel to the carriage guide shaft 62, and is driven by the carriage motor 61.

The carriage 20 is reciprocally supported by the carriage guide shaft 62, and is secured on part of the timing belt 63. Therefore, when the timing belt 63 is moved forward and backward by the carriage motor 61, the carriage 20 reciprocates while being guided by the carriage guide shaft 62.

A print head 22 is provided to the carriage 20. The print head 22 includes a plurality of nozzles that are provided in an area opposite to the medium P and independently eject the ink in the Z-direction. Note that the print head 22 is schematically divided into four blocks in order to implement color printing. Each block ejects a black (Bk) ink, a cyan (C) ink, a magenta (M) ink, or a yellow (Y) ink.

Various control signals and the like including a drive signal are supplied to the carriage 20 from a main board (not illustrated in FIG. 1) through a flexible flat cable 190.

The printer 1 includes a feed mechanism 8 that feeds the medium P on a platen 80. The feed mechanism 8 includes a feed motor 81 (i.e., drive source), and a feed roller 82 that is rotated by the feed motor 81, and feeds the medium P in the sub-scan direction (Y-direction).

An image is formed to the surface of the medium P by repeating an operation that ejects the ink from the nozzle of the print head 22 according to print data, and feeds the medium P by the feed mechanism 8 in synchronization with the main scan operation of the carriage 20.

In the first embodiment, the main scan operation is implemented by moving the carriage 20. Note that the main scan operation may be implemented by moving the medium P, or may be implemented by moving both the carriage 20 and the medium P. It suffices that the medium P and the carriage 20 (print head 22) move relative to each other.

FIG. 2A illustrates the ink ejection plane of the print head 22 when viewed from the medium P. As illustrated in FIG. 2A, the print head 22 includes four head units 3. The four head units 3 respectively correspond to black (Bk), cyan (C), magenta (M), and yellow (Y), and are arranged in the X-direction (i.e., main scan direction).

FIG. 2B illustrates the arrangement of the nozzles provided to one head unit 3.

As illustrated in FIG. 2B, one head unit 3 is provided with a plurality of nozzles N that are arranged in two rows. These nozzle rows are referred to as nozzle rows Na and Nb for convenience of explanation.

Each of the nozzle rows Na and Nb includes a plurality of nozzles N that are arranged along the Y-direction at a pitch P1. The nozzle rows Na and Nb are spaced in the Y-direction by a pitch P2. The nozzles N that belong to the nozzle row Na and the nozzles N that belong to the nozzle row Nb are shifted in the Y-direction by half of the pitch P1.

It is possible to substantially double the resolution in the Y-direction as compared with the case where the nozzles N are arranged in one row by arranging the nozzles N in the two nozzle rows Na and Nb so that the nozzles N that belong to the nozzle row Na and the nozzles N that belong to the nozzle row Nb are shifted in the Y-direction by half of the pitch P1.

Note that the number of nozzles N provided to one head unit 3 is referred to as m (m is an integer equal to or larger than 2) for convenience of explanation.

The head unit 3 has a configuration in which a flexible circuit board is connected to an actuator substrate, and a driver IC is mounted on the flexible circuit board. The structure of the actuator substrate is described below.

FIG. 3 is a cross-sectional view illustrating the structure of an actuator substrate 40 taken along the line g-g in FIG. 2B.

As illustrated in FIG. 3, the actuator substrate 40 is a structure in which a pressure chamber substrate 44 and a diaphragm 46 are provided on the −Z-direction-side surface of a flow channel substrate 42, and a nozzle plate 41 is provided on the +Z-direction-side surface of the flow channel substrate 42.

Each element of the actuator substrate 40 is an approximately tabular member that extends in the Y-direction, and is secured by an adhesive, for example. The flow channel substrate 42 and the pressure chamber substrate 44 are formed of a single-crystal silicon substrate, for example.

The nozzles N are formed in the nozzle plate 41. The structure that corresponds to the nozzles that belong to the nozzle row Na and the structure that corresponds to the nozzles that belong to the nozzle row Nb are shifted in the Y-direction by half of the pitch P1, but are formed to be approximately symmetrical with each other. The structure of the actuator substrate 40 is described below while focusing on the nozzle row Na.

The flow channel substrate 42 is a tabular material that forms an ink flow channel. An opening 422, a supply flow channel 424, and a communication flow channel 426 are formed in the flow channel substrate 42. The supply flow channel 424 and the communication flow channel 426 are formed on a nozzle basis. The opening 422 is continuously formed over a plurality of nozzles, and an ink in the corresponding color is supplied to the opening 422. The opening 422 functions as a liquid reservoir Sr, and the bottom of the liquid reservoir Sr is formed by the nozzle plate 41, for example. More specifically, the nozzle plate 41 is secured on the bottom of the flow channel substrate 42 so as to close the opening 422, the supply flow channel 424, and the communication flow channel 426 formed in the flow channel substrate 42.

The diaphragm 46 is provided on the surface of the pressure chamber substrate 44 that is situated opposite to the flow channel substrate 42. The diaphragm 46 is a tabular member that can vibrate elastically. For example, the diaphragm 46 is a laminate that includes an elastic film that is formed of an elastic material (e.g., silicon oxide), and an insulating film that is formed of an insulating material (e.g., zirconium oxide). The diaphragm 46 and the flow channel substrate 42 face each other at an interval inside each opening 422 of the pressure chamber substrate 44. The space that is formed by each opening 422 and situated between the flow channel substrate 42 and the diaphragm 46 functions as a cavity 442 that applies pressure to the ink. Each cavity 442 communicates with the nozzle N through the communication flow channel 426 formed in the flow channel substrate 42.

A piezoelectric element Pzt is formed on the surface of the diaphragm 46 that is situated opposite to the pressure chamber substrate 44, the piezoelectric element Pzt being provided corresponding to each nozzle N (cavity 442).

The piezoelectric element Pzt includes a drive electrode 72 that is formed on the surface of the diaphragm 46 and provided common to a plurality of piezoelectric elements Pzt, a piezoelectric 74 that is formed on the surface of the drive electrode 72, and a drive electrode 76 that is formed on the surface of the piezoelectric 74 and provided corresponding to each piezoelectric element Pzt. An area in which the piezoelectric 74 is sandwiched between the drive electrodes 72 and 76 functions as the piezoelectric element Pzt.

The piezoelectric 74 is formed by a process that includes a heat treatment (calcining), for example. Specifically, the piezoelectric 74 is formed by applying a piezoelectric material to the surface of the diaphragm 46 on which the drive electrode 72 is formed, calcining the piezoelectric material by performing a heat treatment inside a calcination furnace, and forming (e.g., plasma milling) the calcined piezoelectric material corresponding to each piezoelectric element Pzt.

Note that the piezoelectric element Pzt that corresponds to the nozzle row Nb also includes the drive electrode 72, the piezoelectric 74, and the drive electrode 76.

Although an example in which the drive electrode 72 (common drive electrode) is provided under the piezoelectric 74 and the drive electrode 76 (independent drive electrode) is provided over the piezoelectric 74 has been described above, the drive electrode 72 may be provided over the piezoelectric 74, and the drive electrode 76 may be provided under the piezoelectric 74.

The driver IC may be mounted directly on the actuator substrate 40.

As described later, the voltage Vout of the drive signal that corresponds to the amount of ink that should be ejected is independently applied to the drive electrode 76 (i.e., one end) of the piezoelectric element Pzt, and the voltage $V_{BS}$ hold signal is applied in common to the drive electrode 72 (i.e., the other end) of the piezoelectric element Pzt.

Therefore, the piezoelectric element Pzt is deformed upward or downward corresponding to the voltage applied between the drive electrodes 72 and 76. More specifically, the center part of the piezoelectric element Pzt is deformed upward with respect to each end when the voltage Vout of the drive signal applied through the drive electrode 76 has decreased, and deformed downward when the voltage Vout has increased.

When the center part of the piezoelectric element Pzt has been deformed upward, the inner volume of the cavity 442 increases (i.e., a decrease in pressure occurs), and the ink is introduced from the liquid reservoir Sr. On the other hand, when the center part of the piezoelectric element Pzt has been deformed downward, the inner volume of the cavity 442 decreases (i.e., an increase in pressure occurs), and an ink droplet is ejected from the nozzle N corresponding to the decrease in the inner volume of the cavity 442. Specifically, when an appropriate drive signal has been applied to the piezoelectric element Pzt, the ink is ejected from the nozzle N due to the displacement of the piezoelectric element Pzt. Therefore, at least the piezoelectric element Pzt, the cavity 442, and the nozzle N form an ejection section that ejects the ink.

The electrical configuration of the printer 1 is described below.

FIG. 4 is a block diagram illustrating the electrical configuration of the printer 1.

As illustrated in FIG. 4, the printer 1 has a configuration in which the head unit 3 is connected to a main board 100. The head unit 3 is roughly divided into the actuator substrate 40 and a driver IC 50.

The main board 100 supplies a control signal Ctr, a drive signal COM-A, and a drive signal COM-B to the driver IC 50, and supplies a voltage $V_{BS}$ (offset voltage) hold signal to the actuator substrate 40 through a line 550.

Note that the printer 1 has a configuration in which four head units 3 are provided, and the main board 100 controls the four head units 3 independently of each other. The four head units 3 are identical to each other except for the color of the ink that is ejected by each head unit 3. The following description focuses on one head unit 3 for convenience of explanation.

As illustrated in FIG. 4, the main board 100 includes a control section 110, D/A converters (DAC) 113a and 113b, voltage amplifiers 115a and 115b, driver circuits 120a and 120b, and an offset voltage generation circuit 130.

The control section 110 is a microcomputer that includes a CPU, a RAM, a ROM, and the like. When image data that represents the print target image has been supplied from a host computer or the like, the control section 110 executes a predetermined program to output various control signals and the like that control each section.

Specifically, the control section 110 repeatedly supplies digital data dA to the DAC 113a, and repeatedly supplies digital data dB to the DAC 113b. The data dA represents (defines) the waveform of the drive signal COM-A that is supplied to the head unit 3, and the data dB represents (defines) the waveform of the drive signal COM-B that is supplied to the head unit 3.

The DAC 113a converts the data dA into analog data, and supplies the analog data to the voltage amplifier 115a. The DAC 113b converts the data dB into analog data, and supplies the analog data to the voltage amplifier 115b.

The voltage amplifier 115a performs a voltage amplification operation on the analog signal converted by the DAC 113a, and supplies the resulting signal Ain to the driver circuit 120a. The voltage amplifier 115b performs a voltage amplification operation on the analog signal converted by the DAC 113b, and supplies the resulting signal Bin to the driver circuit 120b.

Specifically, the signal (source drive signal) converted by the DAC 113a (113b) is subjected to the voltage amplification operation performed by the voltage amplifier 115a (115b), and input to the driver circuit 120a (120b) as the signal Ain (Bin).

The details of the driver circuit 120a are described later. The driver circuit 120a is a voltage follower. The driver circuit 120a increases the drive capability of the high-impedance signal Ain with respect to the piezoelectric element Pzt (i.e., capacitive load) (i.e., converts the high-impedance signal Ain into a low-impedance signal), and outputs the resulting signal as the drive signal COM-A. Likewise, the driver circuit 120b outputs the signal Bin as the low-impedance drive signal COM-B.

The amplitude of the signal converted by the DAC 113a (113b) ranges from about 0 V to about 3 V, and the amplitude of the drive signal COM-A (COM-B) ranges from about 0 V to about 40 V. Therefore, the voltage amplifier 115a (115b) performs the voltage amplification operation on the signal converted by the DAC 113a (113b), and supplies the resulting signal to the driver circuit 120a (120b) (voltage follower).

Note that the driver circuits 120a and 120b differ as to only the input signal and the waveform of the drive signal to be output, and have an identical circuit configuration.

The control section 110 supplies various control signals Ctr to the head unit 3 in synchronization with the control process performed on the moving mechanism 6 and the feed mechanism 8. Note that the control signals Ctr supplied to the head unit 3 include print data that represents the amount of ink to be ejected from the nozzle N, a clock signal that is used to transfer the print data, and a timing signal that represents the print cycle and the like, for example.

The control section 110 controls the moving mechanism 6 and the feed mechanism 8. The configuration for controlling the moving mechanism 6 and the feed mechanism 8 is known in the art, and description thereof is omitted.

The offset voltage generation circuit 130 included in the main board 100 generates the voltage $V_{BS}$ hold signal, and outputs the voltage $V_{BS}$ hold signal through the line 550. Note that the voltage $V_{BS}$ is used to hold the other end of each of a plurality of piezoelectric elements Pzt provided to the actuator substrate 40 in a constant state.

The driver IC 50 included in the head unit 3 includes a selection control section 510, and selection sections 520 that correspond to the piezoelectric elements Pzt on a one-to-one basis. The selection control section 510 controls the selection operation performed by each selection section 520. More specifically, the selection control section 510 temporarily stores the print data supplied from the control section 110 in synchronization with the clock signal corresponding to several nozzles (piezoelectric elements Pzt) of the head unit 3, and instructs each selection section 520 to select the drive signal COM-A or COM-B according to the print data at the start timing of the print cycle that is represented by the timing signal.

Each selection section 520 selects the drive signal COM-A or COM-B (or does not select the drive signals COM-A and COM-B) according to the instruction issued by the selection control section 510, and applies the selected drive signal COM-A or COM-B to one end of the corresponding piezoelectric element Pzt as a voltage Vout drive signal.

The piezoelectric elements Pzt are provided to the actuator substrate 40 so as to have a one-to-one relationship with the nozzles N (see above). The other end of each of the piezoelectric elements Pzt is connected in common, and the voltage $V_{BS}$ generated by the offset voltage generation circuit 130 is applied to the other end of each of the piezoelectric elements Pzt through the line 550.

In the first embodiment, the ink is ejected from each nozzle N up to twice so that each dot can represent four grayscales (large dot, medium dot, small dot, and non-recording). In the first embodiment, the drive signals COM-A and COM-B are provided, and a first-half pattern and a second-half pattern are provided within one cycle in order to represent the above four grayscales. The drive signal COM-A or COM-B is selected (or the drive signals COM-A and COM-B are not selected) according to the target grayscale in each of the first-half period and the second-half period within one cycle, and supplied to the piezoelectric element Pzt.

The drive signals COM-A and COM-B, and a specific configuration of the selection control section 510 and the selection section 520 that select the drive signal COM-A or COM-B are described below.

FIG. 5 illustrates the waveform of the drive signals COM-A and COM-B and the like.

As illustrated in FIG. 5, the drive signal COM-A has a waveform in which a trapezoidal waveform Adp1 and a trapezoidal waveform Adp2 repeatedly occur alternately, the trapezoidal waveform Adp1 being provided in a period T1 of a print cycle Ta that starts when a control signal LAT is output (rises) and ends when a control signal CH is output, and the trapezoidal waveform Adp2 being provided in a period T2 of the print cycle Ta that starts when the control signal CH is output and ends when the control signal LAT is output.

In the first embodiment, the trapezoidal waveforms Adp1 and Adp2 are almost identical to each other. When each of the trapezoidal waveforms Adp1 and Adp2 is supplied to one end of the piezoelectric element Pzt, a predetermined amount (i.e., medium amount) of ink is ejected from the nozzle N that corresponds to the piezoelectric element Pzt.

The drive signal COM-B has a waveform in which a trapezoidal waveform Bdp1 that is provided in the period T1 and a trapezoidal waveform Bdp2 that is provided in the period T2 repeatedly occur alternately. In the first embodiment, the trapezoidal waveforms Bdp1 and Bdp2 differ from each other. The trapezoidal waveform Bdp1 is a waveform that prevents an increase in the viscosity of the ink by finely vibrating the ink that is situated in the vicinity of the nozzle N. Therefore, even if the trapezoidal waveform Bdp1 is supplied to one end of the piezoelectric element Pzt, an ink droplet is not ejected from the nozzle N that corresponds to the piezoelectric element Pzt. The trapezoidal waveform Bdp2 differs from the trapezoidal waveform Adp1 (Adp2). When the trapezoidal waveform Bdp2 is supplied to one end of the piezoelectric element Pzt, the ink is ejected from the nozzle N that corresponds to the piezoelectric element Pzt in an amount smaller than the above predetermined amount.

Note that the voltage at the start timing of the trapezoidal waveforms Adp1, Adp2, Bdp1, and Bdp2 and the voltage at the end timing of the trapezoidal waveforms Adp1, Adp2, Bdp1, and Bdp2 are identical (i.e., voltage Vcen). Specifically, the trapezoidal waveforms Adp1, Adp2, Bdp1, and Bdp2 start at the voltage Vcen, and end at the voltage Vcen.

The maximum voltage value of the trapezoidal waveform Adp1 is about 40 V.

FIG. 6 illustrates the configuration of the selection control section 510 illustrated in FIG. 4.

As illustrated in FIG. 6, a clock signal Sck, print data SI, and the control signals LAT and CH are supplied to the selection control section 510. The selection control section 510 has a configuration in which a set of a shift register (S/R) 512, a latch circuit 514, and a decoder 516 is provided corresponding to each piezoelectric element Pzt (nozzle N).

The print data SI represents the dot that should be formed by each nozzle N of the head unit 3 in the print cycle Ta. In the first embodiment, the print data that corresponds to one nozzle includes the most significant bit (MSB) and the least significant bit (LSB) so that each dot can represent four grayscales (non-recording, small dot, medium dot, and large dot).

The print data SI is supplied corresponding to each nozzle N (piezoelectric element Pzt) in synchronization with the clock signal Sck while the medium P is fed. The shift register 512 temporarily stores the 2-bit print data SI corresponding to the nozzle N.

More specifically, the shift registers 512 (m stages in total) that respectively correspond to m piezoelectric elements Pzt (nozzles) are cascade-connected, and the print data SI supplied to the first-stage shift register 512 that is situated on the left side in FIG. 6 is sequentially transferred to the subsequent stage (downstream side) in synchronization with the clock signal Sck.

In FIG. 6, the first-stage shift register 512, the second-stage shift register 512, . . . , and the mth-stage shift register 512 are sequentially provided from the upstream side where the print data SI is supplied.

The latch circuit 514 latches the print data SI stored in the shift register 512 at the rising edge of the control signal LAT.

The decoder 516 decodes the 2-bit print data SI latched by the latch circuit 514, and outputs selection signals Sa and Sb in each of the periods T1 and T2 defined by the control signal LAT and the control signal CH to control the selection operation performed by the selection section 520.

FIG. 7 illustrates the decoding results of the decoder 516.

In FIG. 7, the latched 2-bit print data SI is represented by (MSB, LSB). For example, when the latched print data SI is (0, 1), the decoder 516 outputs the selection signal Sa set to the H level and the selection signal Sb set to the L level in the period T1, and outputs the selection signal Sa set to the L level and the selection signal Sb set to the H level in the period T2.

Note that the logic level of the selection signals Sa and Sb is shifted by a level shifter (not illustrated in the drawings) to have a high amplitude as compared with the logic level of the clock signal Sck, the print data SI, and the control signals LAT and CH.

FIG. 8 illustrates the configuration of the selection section 520 in FIG. 4.

As illustrated in FIG. 8, the selection section 520 includes inverters (NOT circuits) 522a and 522b, and transfer gates 524a and 524b.

The selection signal Sa from the decoder 516 is supplied to the positive control terminal of the transfer gate 524a, and is also supplied to the negative control terminal (indicated by the circle) of the transfer gate 524a after being inverted (in logic) by the inverter 522a. Likewise, the selection signal Sb from the decoder 516 is supplied to the positive control terminal of the transfer gate 524b, and is also supplied to the negative control terminal of the transfer gate 524b after being inverted (in logic) by the inverter 522b.

The drive signal COM-A is supplied to the input terminal of the transfer gate 524a, and the drive signal COM-B is supplied to the input terminal of the transfer gate 524b. The output terminal of the transfer gate 524a and the output terminal of the transfer gate 524b are connected in common to one end of the corresponding piezoelectric element Pzt.

The transfer gate 524a is configured so that the input terminal and the output terminal are connected (ON) when the selection signal Sa is set to the H level, and are disconnected (OFF) when the selection signal Sa is set to the L level. Likewise, the transfer gate 524b is configured so that the input terminal and the output terminal are connected (ON) or disconnected (OFF) corresponding to whether the selection signal Sb is set to the H level or the L level.

As illustrated in FIG. 5, the print data SI is supplied corresponding to each nozzle in synchronization with the clock signal Sck, and sequentially transferred to the shift register 512 that corresponds to each nozzle. When the supply of the clock signal Sck has stopped, the print data SI that corresponds to each nozzle is stored in each shift register 512.

When the control signal LAT has risen, each latch circuit 514 simultaneously latches the print data SI stored in the corresponding shift register 512. In FIG. 5, the numerals that correspond to L1, L2, . . . , and Lm represent the print data SI latched by the latch circuits 514 that correspond to the first-stage shift register 512, the second-stage shift register 512, . . . , and the mth-stage shift register 512.

The decoder 516 outputs the logic levels of the selection signals Sa and Sa as illustrated in FIG. 7 in each of the periods T1 and T2 corresponding to the dot size represented by the latched print data SI.

Specifically, when the print data SI is (1, 1) (i.e., large dot size), the decoder 516 sets the selection signals Sa and Sb respectively to the H level and the L level in the period T1, and also sets the selection signals Sa and Sb respectively to the H level and the L level in the period T2. When the print data SI is (0, 1) (i.e., medium dot size), the decoder 516 sets the selection signals Sa and Sb respectively to the H level and the L level in the period T1, and sets the selection signals Sa and Sb respectively to the L level and the H level in the period T2. When the print data SI is (1, 0) (i.e., small dot size), the decoder 516 sets the selection signals Sa and Sb to the L level in the period T1, and sets the selection signals Sa and Sb respectively to the L level and the H level in the period T2. When the print data SI is (0, 0) (i.e., non-recording), the decoder 516 sets the selection signals Sa and Sb respectively to the L level and the H level in the period T1, and sets the selection signals Sa and Sb to the L level in the period T2.

FIG. 9 illustrates the voltage waveform of the drive signal that is selected corresponding to the print data SI, and supplied to one end of the piezoelectric element Pzt.

When the print data SI is (1, 1), the selection signals Sa and Sb are respectively set to the H level and the L level in the period T1. Therefore, the transfer gate 524*a* is turned ON, and the transfer gate 524*b* is turned OFF. Therefore, the selection section 520 selects the trapezoidal waveform Adp1 of the drive signal COM-A in the period T1.

Since the selection signals Sa and Sb are respectively set to the H level and the L level in the period T2, the selection section 520 selects the trapezoidal waveform Adp2 of the drive signal COM-A.

When the trapezoidal waveform Adp1 selected in the period T1 and the trapezoidal waveform Adp2 selected in the period T2 are supplied to one end of the piezoelectric element Pzt as the drive signal, a medium amount of ink is ejected twice from the nozzle N that corresponds to the piezoelectric element Pzt. The ink droplets reach the medium P and unite to form a large dot represented by the print data SI.

When the print data SI is (0, 1), the selection signals Sa and Sb are respectively set to the H level and the L level in the period T1. Therefore, the transfer gate 524*a* is turned ON, and the transfer gate 524*b* is turned OFF. Therefore, the selection section 520 selects the trapezoidal waveform Adp1 of the drive signal COM-A in the period T1. Since the selection signals Sa and Sb are respectively set to the L level and the H level in the period T2, the selection section 520 selects the trapezoidal waveform Bdp2 of the drive signal COM-B.

Therefore, a medium amount of ink and a small amount of ink are separately ejected from the nozzle. The ink droplets reach the medium P and unite to form a medium dot represented by the print data SI.

When the print data SI is (1, 0), the selection signals Sa and Sb are set to the L level in the period T1. Therefore, the transfer gates 524*a* and 524*b* are turned OFF. In this case, the trapezoidal waveforms Adp1 and Bdp1 are not selected in the period T1. When the transfer gates 524*a* and 524*b* are turned OFF, the path from the connection point of the output terminal of the transfer gate 524*a* and the output terminal of the transfer gate 524*b* to one end of the piezoelectric element Pzt is set to a high-impedance state (i.e., electrically disconnected state). However, the voltage (Vcen−$V_{BS}$) immediately before the transfer gate is turned OFF is maintained between the ends of the piezoelectric element Pzt due to its capacitance.

Since the selection signals Sa and Sb are also respectively set to the L level and the H level in the period T2, the selection section 520 selects the trapezoidal waveform Bdp2 of the drive signal COM-B. Therefore, a small amount of ink is ejected from the nozzle N only in the period T2 to form a small dot represented by the print data SI on the medium P.

When the print data SI is (0, 0), the selection signals Sa and Sb are respectively set to the L level and the H level in the period T1. Therefore, the transfer gate 524*a* is turned OFF, and the transfer gate 524*b* is turned ON. Therefore, the selection section 520 selects the trapezoidal waveform Bdp1 of the drive signal COM-B in the period T1. Since the selection signals Sa and Sb are set to the L level in the period T2, the trapezoidal waveforms Adp2 and Bdp2 are not selected.

Therefore, since the ink is merely finely vibrated in the vicinity of the nozzle N (i.e., the ink is not ejected) in the period T1, a dot is not formed (i.e., non-recording represented by the print data SI).

The selection section 520 thus selects the drive signal COM-A or COM-B (or does not select the drive signals COM-A and COM-B) according to the instruction issued by the selection control section 510, and applies the selected drive signal COM-A or COM-B to one end of the piezoelectric element Pzt. Therefore, each piezoelectric element Pzt is driven corresponding to the dot size represented by the print data SI.

Note that the drive signals COM-A and COM-B illustrated in FIG. 5 are merely an example. A combination of various waveforms provided in advance is used corresponding to the properties and the feed speed of the medium P, and the like.

An example in which the piezoelectric element Pzt is deformed upward along with a decrease in voltage has been described above. When the voltage applied to the drive electrodes 72 and 76 is reversed, the piezoelectric element Pzt is deformed downward along with a decrease in voltage. Therefore, when using a configuration in which the piezoelectric element Pzt is deformed downward along with a decrease in voltage, the drive signals COM-A and COM-B illustrated in the drawings have a waveform that is inverted with respect to the voltage Vcen.

The driver circuits 120*a* and 120*b* included in the main board 100 is described below taking the driver circuit 120*a* that outputs the drive signal COM-A as an example.

FIG. 10 is a circuit diagram illustrating the configuration of the driver circuit 120*a*.

As illustrated in FIG. 10, the driver circuit 120*a* includes reference power supplies 211 and 212, comparators 221 and 222, transistors 231 and 232, and a capacitor 241.

The reference power supply (first offset section) 211 generates (outputs) a voltage $V_1$ between the positive terminal and the negative terminal. The positive terminal of the reference power supply 211 is connected to a terminal N1 to which a voltage Vin of the signal Ain from the voltage amplifier 115*a* (see FIG. 4) is supplied, and the negative terminal of the reference power supply 211 is connected to the negative input terminal (−) of the comparator 221. Therefore, a voltage (Vin−$V_1$) obtained by subtracting the voltage $V_1$ from the voltage Vin (input signal) is applied to the negative input terminal (−) of the comparator 221. The positive input terminal (+) of the comparator 221 is connected to a terminal N2 from which the drive signal COM-A is output.

The comparator (first comparator section) 221 outputs a signal Gt1 that corresponds to the result of comparison between the voltage applied to the positive input terminal (+) and the voltage applied to the negative input terminal (−) as a first control signal. More specifically, the comparator 221 outputs the signal Gt1 that is set to the H level when a voltage Out (i.e., the voltage of the drive signal COM-A) applied to the positive input terminal (+) is equal to or higher than the voltage (Vin−$V_1$) applied to the negative input terminal (−), and outputs the signal Gt1 that is set to the L level when the voltage Out is lower than the voltage (Vin−$V_1$).

The signal of the voltage (Vin−$V_1$) applied to the negative input terminal (−) of the comparator 221 is referred to as "first comparison signal", and the signal of the voltage Out applied to the positive input terminal (+) of the comparator 221 is referred to as "second comparison signal" (offset voltage=0).

The reference power supply (second offset section) 212 generates (outputs) a voltage $V_2$ between the positive terminal and the negative terminal. The negative terminal of the reference power supply 212 is connected to the terminal N1, and the positive terminal of the reference power supply 212 is connected to the negative input terminal (−) of the comparator 222. Therefore, a voltage (Vin+$V_2$) obtained by adding the voltage $V_2$ to the voltage Vin (input signal) is applied to the negative input terminal (−) of the comparator 221. The positive input terminal (+) of the comparator (second comparator section) 221 is connected to the terminal N2.

The comparator 222 outputs a signal Gt2 that corresponds to the result of comparison between the voltage applied to the positive input terminal (+) and the voltage applied to the negative input terminal (−) as a second control signal. More specifically, the comparator 222 outputs the signal Gt2 that is set to the H level when the voltage Out applied to the positive input terminal (+) is equal to or higher than the voltage (Vin+$V_2$) applied to the negative input terminal (−), and outputs the signal Gt2 that is set to the L level when the voltage Out is lower than the voltage (Vin+$V_2$).

The signal of the voltage (Vin+$V_2$) applied to the negative input terminal (−) of the comparator 222 is referred to as "third comparison signal", and the signal of the voltage Out applied to the positive input terminal (+) of the comparator 222 is referred to as "fourth comparison signal" (offset voltage=0).

The comparators 221 and 222 form a comparator unit.

The transistor (first transistor) 231 that makes a pair with the transistor 232 is a P-channel-type field-effect transistor, for example. A high-potential-side voltage $V_H$ from a power supply is applied to the source terminal of the transistor 231, the drain terminal of the transistor 231 is connected to the terminal N2, and the signal Gt1 output from the comparator 221 is supplied to the gate terminal of the transistor 231.

The transistor (second transistor) 232 is an N-channel-type field-effect transistor, for example. A low-potential-side voltage $V_L$ from the power supply is applied to the source terminal of the transistor 232, the drain terminal of the transistor 232 is connected to the terminal N2, and the signal Gt2 output from the comparator 222 is supplied to the gate terminal of the transistor 232.

Specifically, the transistors 231 and 232 are inserted electrically in series between the power supply voltages, and the drive signal COM-A is output from the terminal N2 that is the connection point of the transistors 231 and 232.

Note that a ground voltage Gnd (=0 V) is used as the low-potential-side voltage $V_L$, for example. When the voltage $V_H$ and the ground voltage Gnd are used as the power supply voltages, the H level of the signals Gt1 and Gt2 corresponds to the voltage $V_H$, and the L level of the signals Gt1 and Gt2 corresponds to the ground voltage Gnd.

One end of the capacitor 241 is connected to the terminal N2, and the other end of the capacitor 241 is connected to the line 550 set at a constant potential (e.g., voltage $V_{BS}$).

According to the driver circuit 120a having the above configuration, when the voltage Out at the terminal N2 is lower than the voltage (Vin−$V_1$), the signal Gt1 is set to the L level, and the transistor 231 is turned ON, so that the voltage Out increases. On the other hand, when the voltage Out is equal to or higher than the voltage (Vin+$V_2$), the signal Gt2 is set to the H level, and the transistor 232 is turned ON, so that the voltage Out decreases. As a result, the driver circuit 120a implements a control process that causes the voltage Vout to follow the voltage Vin.

This control process is described in detail below.

FIGS. 11 and 12 illustrate changes in the drive signal COM-A (i.e., voltage Out) with respect to a change in the voltage Vin of the signal Ain.

Since the signal Ain (voltage Vin) before subjecting the drive signal COM-A to impedance conversion has a trapezoidal waveform, the voltage Vin changes in a first pattern in which the voltage Vin increases and becomes constant, a second pattern in which the voltage Vin that has been constant decreases, a third pattern in which the voltage Vin decreases and becomes constant, or a fourth pattern in which the voltage Vin that has been constant increases. Note that the voltage Vin does not necessarily change in this order.

The left side of FIG. 11 illustrates the waveform of the voltage Out when the voltage Vin changes in the first pattern.

When the voltage Vin increases, the voltage (Vin−$V_1$) increases along with an increase in the voltage Vin. When the voltage Out has become lower than the voltage (Vin−$V_1$) that increases along with an increase in the voltage Vin, the signal Gt1 is set to the L level, and the transistor 231 is turned ON, so that the voltage Out increases. However, since the voltage Out immediately becomes equal to or higher than the voltage (Vin−$V_1$), the signal Gt1 is set to the H level, and the transistor 231 is turned OFF. Since such an operation is repeated when the voltage Vin increases, the voltage Out ideally changes in a stair-like pattern as indicated by the broken line in FIG. 11. However, since an integration circuit is formed on the output side with respect to the terminal N2 due to the resistance of the line that supplies the drive signal COM-A, the inductance component, the piezoelectric element Pzt (load), and the capacitor 241 (load), the actual waveform of the voltage Out is rounded as compared with the stair-like waveform.

Since the voltage (Vin−$V_1$) becomes constant when the voltage Vin has become constant, the voltage Out is maintained by the piezoelectric element Pzt (load) and the capacitor 241 (load) at the value when the transistor 231 was turned OFF.

The right side of FIG. 11 illustrates the waveform of the voltage Out when the voltage Vin changes in the second pattern.

When the voltage Vin that has been constant decreases, the voltage (Vin+$V_2$) decreases along with a decrease in the voltage Vin. When the voltage Out that has been constant has become equal to or higher than the voltage (Vin+$V_2$) that decreases along with a decrease in the voltage Vin, the transistor 232 is turned ON, so that the voltage Out decreases. However, since the voltage Out immediately becomes lower than the voltage (Vin+$V_2$), the transistor 232 is turned OFF. Since such an operation is repeated when the voltage Vin decreases, the voltage Out ideally changes in a stair-like pattern as indicated by the broken line in FIG. 11. However, the actual waveform of the voltage Out is rounded due to the integration circuit.

The left side of FIG. 12 illustrates the waveform of the voltage Out when the voltage Vin changes in the third pattern. When the voltage Vin decreases and becomes constant, the voltage (Vin+$V_2$) also becomes constant, and the voltage Out is maintained at the value when the transistor 232 was turned OFF The right side of FIG. 12 illustrates the waveform of the voltage Out when the voltage Vin changes in the fourth pattern. When the voltage Vin that has been constant increases, the voltage (Vin−$V_1$) increases along with an increase in the voltage Vin. The voltage Out that has been constant becomes lower than the voltage (Vin−$V_1$) that increases along with an increase in the voltage Vin. The subsequent operation is the same as described above in connection with the first pattern.

FIG. 13 illustrates a region in which the transistor 231 or 232 is turned ON with respect to a change in the voltage (Out−Vin).

As illustrated in FIG. 13, only the transistor 231 is turned ON when the voltage (Out−Vin) has become lower than the voltage −$V_1$, and only the transistor 232 is turned ON when the voltage (Out−Vin) has become equal to or higher than the voltage $V_2$.

The transistors 231 and 232 are turned OFF when the voltage (Out−Vin) is equal to or higher than the voltage −$V_1$ and is lower than the voltage $V_2$. Specifically, the driver circuit 120a has a region (dead zone) in which the voltage Out does not change. In the first embodiment, the voltage Out has an error equal to or smaller than the voltage $V_1$ in the negative direction and an error equal to or smaller than the voltage $V_2$ in the positive direction with respect to the voltage Vin due to the dead zone. Note that the error can be reduced by appropriately setting the voltage $V_1$ generated by the reference power supply 211 and the voltage $V_2$ generated by the reference power supply 212. Specifically, the error can be reduced to a practical level when the waveform of the drive signal COM-A has an amplitude of about 40 V by setting the voltages $V_1$ and $V_2$ to about 0.1 V, for example.

Note that the driver circuit 120b is configured and operates in the same manner as the driver circuit 120a.

According to the driver circuits 120a and 120b used in connection with the first embodiment, since a circuit that generates a triangular waveform or the like when modulating the input signal and a low-pass filter for demodulation (that are used when using a class-D amplification method) are unnecessary, it is possible to simplify the circuit configuration, and reduce power consumption.

Since the transistors 231 and 232 are not turned ON when the voltage of the input signal is constant, it is possible to prevent a problem in which electric power is unnecessarily consumed by switching.

Therefore, the driver circuits 120a and 120b make it possible to further reduce power consumption while simplifying the circuit configuration.

The first embodiment has been described above taking an example in which the voltage Vin is offset by the voltage $V_1$ by the reference power supply 211, and offset by the voltage $V_2$ by the reference power supply 212. Note that such an offset configuration need not necessarily be implemented by a device such as a power supply (battery) since it suffices that two voltages can be obtained by offsetting the voltage Vin (or the voltage Out (as described later)) in the positive direction and the negative direction. For example, a plurality of elements such as a diode and a resistor may be combined as described below.

FIG. 14 illustrates a configuration example (another example of the first offset section and the second offset section) for obtaining the voltages (Vin+$V_2$) and (Vin−$V_1$) by offsetting the voltage Vin in the positive direction and the negative direction.

According to the example illustrated in FIG. 14, the voltages (Vin−$V_1$) and (Vin+$V_2$) can be obtained by dividing the range from a voltage obtained by offsetting the voltage Vin in the positive direction by the forward voltage of a diode D1 to a voltage obtained by offsetting the voltage Vin in the negative direction by the forward voltage of a diode D2 by resistors.

Second Embodiment

A second embodiment is described below. Note that the same elements as those described above in connection with the first embodiment are indicated by the same reference signs (symbols), and detailed description thereof is appropriately omitted.

FIG. 15 illustrates the configuration of the driver circuit 120a included in the printer 1 according to the second embodiment.

The driver circuit 120a illustrated in FIG. 15 differs from the driver circuit 120a illustrated in FIG. 10 in that the reference power supplies 211 and 212 used to offset the voltage Vin are not provided. In the second embodiment, a configuration that offsets the voltage Vin is included in the comparators 221 and 222.

More specifically, the comparator 221 outputs the signal Gt1 (first control signal) that is set to the H level when the voltage Out (i.e., the voltage of the drive signal COM-A) is equal to or higher than the voltage (Vin−$V_1$) obtained by offsetting the voltage Vin in the negative direction by the voltage $V_1$, and outputs the signal Gt1 that is set to the L level when the voltage Out is lower than the voltage (Vin−$V_1$). In the second embodiment, the signal of the voltage (Vin−$V_1$) is referred to as "first comparison signal", and the signal of the voltage Out is referred to as "second comparison signal" (offset voltage=0).

Likewise, the comparator 222 outputs the signal Gt2 (second control signal) that is set to the H level when the voltage Out is equal to or higher than the voltage (Vin+$V_2$) obtained by offsetting the voltage Vin in the positive direction by the voltage $V_2$, and outputs the signal Gt2 that is set to the L level when the voltage Out is lower than the voltage (Vin+$V_2$). In the second embodiment, the signal of the voltage (Vin+$V_2$) is referred to as "third comparison signal", and the signal of the voltage Out is referred to as "fourth comparison signal" (offset voltage=0).

The configuration of a normal comparator is described below before describing the details of the comparators 221 and 222. Note that the term "normal comparator" used herein refers to a comparator that outputs a signal set to the H level when the voltage applied to the positive input terminal (+) is equal to or higher than the voltage applied to the negative input terminal (−), and outputs a signal set to the L level when the voltage applied to the positive input terminal (+) is lower than the voltage applied to the negative input terminal (−).

FIG. 17 illustrates an example of the configuration of the normal comparator.

As illustrated in FIG. 17, the normal comparator includes transistors Q1 and Q2 that make up a differential pair to which the voltage Vin(+) applied to the positive input terminal (+) and the voltage Vin(−) applied to the negative input terminal (−) are respectively applied, the transistors Q3 and Q4 that serve as an active load, a transistor Q5 for single-end conversion, and transistors Q7 and Q8 that function as a pull-down resistor due to a current I that flows through the transistor Q6.

When Vin(+)≥Vin(−), a current flows through the transistor Q1 (i.e., one of the transistors that make up a differential pair), and the transistor Q2 (i.e., the other of the transistors that make up a differential pair) is turned OFF. Therefore, a voltage is applied to the gate of the transistor Q5 through the transistor Q1 so that the transistor Q5 is turned ON, and an output signal Cout is set to the H level.

When Vin(+)<Vin(−), a current flows through the transistor Q2, and the transistor Q1 is turned OFF. Therefore, since a current flows through the transistor Q4, a voltage is not applied to the gate of the transistor Q5 through the transistor Q3 so that the transistor Q5 is turned OFF, and the output signal Cout is set to the L level.

Note that the output signal Cout is set to the H level when Vin(+)=Vin(−), for example.

FIG. 16A illustrates an example of the configuration of the comparator 221 according to the second embodiment.

In FIG. 16A, the transistor Q2 illustrated in FIG. 17 is replaced by transistors Q2a and Q2b that are connected in series. Each of the transistors Q2a and Q2b is designed so that the characteristics in which a current flows between the source and the drain with respect to the gate voltage are almost identical to those of the transistor Q1. When the transistors Q2a and Q2b that are connected in series are considered to be one transistor Q2, the transistors Q1 and Q2 differ in characteristics (i.e., a current more easily flows through the transistor Q1 than the transistor Q2). More specifically, a current flows through the transistor Q1 when the voltage Out applied to the positive input terminal (+) has become equal to or higher than a voltage (Vin−α) that is lower than the voltage Vin applied to the negative input terminal by a voltage α, and the output signal Gt1 is set to the H level.

In the comparator 221 (first comparator section) illustrated in FIG. 16A, the transistors Q2a and Q2b that are connected in series and correspond to the transistor Q2 to which the voltage Vin of the input signal is input at the gate correspond to the third transistor, and the transistor Q1 to which the voltage Out of the drive signal is input at the gate corresponds to the fourth transistor.

The number of transistors that are connected in series and correspond to the transistor Q2 is not limited to 2. For example, the number of transistors that are connected in series is set so that the voltage α is equal to the voltage $V_1$, so that the signal Gt1 is set to the H level when the voltage Out is equal to or higher than the voltage (Vin−$V_1$), and set to the L level when the voltage Out is lower than the voltage (Vin−$V_1$).

FIG. 16B illustrates an example of the configuration of the comparator 222 according to the second embodiment.

In FIG. 16B, the transistor Q2 illustrated in FIG. 17 is replaced by transistors Q2c and Q2d that are connected in parallel. Each of the transistors Q2c and Q2d is designed so that the characteristics in which a current flows between the source and the drain with respect to the gate voltage are almost identical to those of the transistor Q1. When the transistors Q2c and Q2d that are connected in parallel are considered to be one transistor Q2, the transistors Q1 and Q2 differ in characteristics (i.e., a current less easily flows through the transistor Q1 than the transistor Q2). More specifically, a current flows through the transistor Q1 when the voltage Out applied to the positive input terminal (+) has become equal to or higher than a voltage (Vin−β) that is higher than the voltage Vin applied to the negative input terminal by a voltage β, and the output signal Gt2 is set to the H level.

In the comparator 222 (second comparator section) illustrated in FIG. 16B, the transistors Q2c and Q2d that are connected in parallel and correspond to the transistor Q2 to which the voltage Vin of the input signal is input at the gate correspond to the fifth transistor, and the transistor Q1 to which the voltage Out of the drive signal is input at the gate corresponds to the sixth transistor.

The number of transistors that are connected in parallel and correspond to the transistor Q2 is not limited to 2. For example, the number of transistors that are connected in parallel is set so that the voltage 3 is equal to the voltage $V_2$, so that the signal Gt2 is set to the H level when the voltage Out is equal to or higher than the voltage (Vin+$V_2$), and set to the L level when the voltage Out is lower than the voltage (Vin+$V_2$).

It suffices that the comparators 221 and 222 be configured so that the transistors Q1 and Q2 that make a differential pair differ in characteristics. Specifically, the transistors Q1 and Q2 may be designed to differ in the number of transistors that are connected in series or parallel, the channel size, the doping amount, or the like.

According to the driver circuit 120a having the above configuration, since the voltage Out increases when the voltage Out at the terminal N2 is lower than the voltage (Vin−$V_1$), and decreases when the voltage Out is equal to or higher than the voltage (Vin+$V_2$), the driver circuit 120a implements a control process that causes the voltage Vout to follow the voltage Vin in the same manner as described above in connection with the first embodiment.

Note that the driver circuit 120b is configured and operates in the same manner as the driver circuit 120a.

Application Examples, Modifications, and the Like

The invention is not limited to the above embodiments (e.g., first embodiment and second embodiment). Various applications and modifications as described below can be made of the above embodiments. The following applications and modifications may be appropriately combined.

Channel Type and the Like of Transistors

Although the above embodiments have been described taking an example in which the transistor 231 is a P-channel-type transistor and the transistor 232 is an N-channel-type transistor, both the transistors 231 and 232 may be either a P-channel-type transistor or an N-channel-type transistor.

Although the above embodiments have been described taking an example in which the transistors 231 and 232 are switching devices (switching elements) that are turned ON or OFF, the invention is not limited thereto. For example, the drain current (i.e., the resistance between the source and the drain) may be changed corresponding to the gate-source voltage. It suffices that the transistor 231 (232) be controlled by the signal Gt1 (Gt2).

Offset Voltage

The above embodiments have been described taking an example in which the comparator 221 included in the driver circuit 120a determines whether or not the voltage Out is equal to or higher than the voltage (Vin−$V_1$) (or whether or not the voltage Out is lower than the voltage (Vin−$V_1$)).

Specifically, the above embodiments have been described taking an example in which the comparator 221 determines whether or not Out≥Vin−$V_1$ (or whether or not Out<Vin−$V_1$).

Since the expressions "Out≥Vin−$V_1$" and "Out<Vin−$V_1$" can respectively be transformed into "Out+$V_1$≥Vin" and "Out+$V_1$<Vin", the comparator 221 may determine whether or not the voltage (Out+$V_1$) is equal to or higher than the voltage Vin (or whether or not the voltage (Out+$V_1$) is lower than the voltage Vin).

The expressions "Out≥Vin−$V_1$" and "Out<Vin−$V_1$" can also respectively be transformed into "Out+$V_1$/2≥Vin−$V_1$/2" and "Out+$V_1$/2<Vin−$V_1$/2", for example.

Therefore, the comparator 221 may determine whether or not the voltage (Out+$V_1$/2) is equal to or higher than the voltage (Vin−$V_1$/2) (or whether or not the voltage (Out+$V_1$/2) is lower than the voltage (Vin−$V_1$/2)).

In summary, it suffices that the comparator 221 be configured to compare voltages obtained by offsetting one of the voltage Vin (input signal) and the voltage Out (drive signal) (output) by the voltage $V_1$ relative to the other by shifting the level of at least one of the voltage Vin and the voltage Out.

The above embodiments have been described taking an example in which the comparator 222 determines whether or not Out≥Vin+$V_2$ (or whether or not Out<Vin+$V_2$).

Since the expressions "Out≥Vin+$V_2$" and "Out<Vin+$V_2$" can respectively be transformed into "Out−$V_2$≥Vin" and "Out−$V_2$<Vin", the comparator 222 may determine whether or not the voltage (Out−$V_2$) is equal to or higher than the voltage Vin (or whether or not the voltage (Out−$V_2$) is lower than the voltage Vin).

The expressions "Out≥Vin+$V_2$" and "Out<Vin+$V_2$" can also respectively be transformed into "Out−$V_2$/2≥Vin+$V_2$/2" and "Out−$V_2$/2<Vin+$V_2$/2", for example.

Therefore, the comparator 222 may determine whether or not the voltage (Out−$V_2$/2) is equal to or higher than the voltage (Vin+$V_2$/2) (or whether or not the voltage (Out−$V_2$/2) is lower than the voltage (Vin+$V_2$/2)).

In summary, it suffices that the comparator 222 be configured to compare voltages obtained by offsetting one of the voltage Vin (input signal) and the voltage Out (drive signal) (output) by the voltage $V_2$ relative to the other by shifting the level of at least one of the voltage Vin and the voltage Out.

Voltage Amplification Operation

The above embodiments have been described taking an example in which the signal (source drive signal) converted by the DAC 113a (113b) is subjected to the voltage amplification operation performed by the voltage amplifier 115a (115b), and input to the driver circuit 120a (120b) as the signal Ain (Bin). If the drive signal COM-A (COM-B) (output) is decreased in voltage by a predetermined factor, and fed back to the comparators 221 and 222, and two transistors that are inserted in series between the power supply voltages corresponding to the output voltage are controlled based on signals obtained by shifting the level of the outputs from the comparators 221 and 222, it is possible to compare the source drive signal directly with the drive signal that has been decreased in voltage. In this case, it is unnecessary to provide the voltage amplifiers 115a and 115b.

Others

Although the above embodiments have been described taking an example in which the liquid ejecting device is a printer, the liquid ejecting device may be a three-dimensional printer that forms a three-dimensional object by ejecting a liquid, a printer that dyes cloth by ejecting a liquid, or the like.

Although the above embodiments have been described taking an example in which the driver circuit 120a (120b) drives the piezoelectric element Pzt that is used to eject an ink, the driver circuit 120a need not necessarily drive the piezoelectric element Pzt when the driver circuit 120a is used separately from a printer. For example, the driver circuit 120a can also be applied to an arbitrary capacitive load that is used for an ultrasonic motor, a touch panel, an electrostatic loudspeaker, a liquid crystal panel, and the like.

The entire disclosures of Japanese Patent Application Nos. 2015-058456 and 2015-058458, both filed on Mar. 20, 2015, are expressly incorporated by reference herein.

The invention claimed is:

1. A driver circuit that drives a capacitive load with a drive signal, the driver circuit comprising:
   a comparator unit that includes a first comparator section and a second comparator section, receives an input signal and the drive signal, and outputs a first control signal and a second control signal;
   a transistor pair that includes a first transistor that is controlled based on the first control signal and a second transistor that is controlled based on the second control signal, and outputs the drive signal;
   a first offset section that lowers the input signal by a first voltage, or raises the drive signal by the first voltage; and
   a second offset section that raises the input signal by a second voltage, or lowers the drive signal by the second voltage,
   the first transistor and the second transistor being located electrically in series between the power supply voltages,
   the drive signal being output from a terminal that is a connection point of the first transistor and the second transistor,
   the first comparator section comparing a first comparison signal and a second comparison signal and outputting the first control signal,
   the first comparison signal being a signal obtained by offsetting one of the input signal and the drive signal,
   the second comparator section comparing a third comparison signal and a fourth comparison signal and outputting the second control signal, and
   the third comparison signal being a signal obtained by offsetting one of the input signal and the drive signal.

2. The driver circuit as defined in claim 1,
   the second comparison signal being a signal obtained by offsetting the other of the input signal and the drive signal by a voltage including 0 V, and
   the fourth comparison signal being a signal obtained by offsetting the other of the input signal and the drive signal by a voltage including 0 V.

3. The driver circuit as defined in claim 1,
   each of the first transistor and the second transistor being a field-effect transistor.

4. The driver circuit as defined in claim 1,
   the first comparator section setting the first control signal to be a signal that causes the first transistor to be turned ON when a voltage of the drive signal is lower than a voltage obtained by subtracting the first voltage from a voltage of the input signal, and
   the second comparator section setting the second control signal to be a signal that causes the second transistor to be turned ON when the voltage of the drive signal is equal to or higher than a voltage obtained by adding the second voltage to the voltage of the input signal.

5. A liquid ejecting device comprising:
   the driver circuit as defined in claim 1; and an ejection section that includes a piezoelectric element that is displaced upon application of the drive signal, and ejects a liquid upon displacement of the piezoelectric element.

6. A driver circuit that drives a capacitive load with a drive signal, the driver circuit comprising:
- a comparator unit that includes a first comparator section and a second comparator section, receives an input signal and the drive signal, and outputs a first control signal and a second control signal; and
- a transistor pair that includes a first transistor that is controlled based on the first control signal and a second transistor that is controlled based on the second control signal, and outputs the drive signal,
- the first transistor and the second transistor being located electrically in series between the power supply voltages,
- the drive signal being output from a terminal that is a connection point of the first transistor and the second transistor,
- the first comparator section comparing a first comparison signal and a second comparison signal and outputting the first control signal,
- the first comparison signal being a signal obtained by offsetting one of the input signal and the drive signal,
- the second comparator section comparing a third comparison signal and a fourth comparison signal and outputting the second control signal,
- the third comparison signal being a signal obtained by offsetting one of the input signal and the drive signal, and
- the input signal being a signal obtained by performing a voltage amplification operation on a source drive signal that is a source of the drive signal.

7. The driver circuit as defined in claim 6,
the second comparison signal being a signal obtained by offsetting the other of the input signal and the drive signal by a voltage including 0 V, and
the fourth comparison signal being a signal obtained by offsetting the other of the input signal and the drive signal by a voltage including 0 V.

8. The driver circuit as defined in claim 6,
each of the first transistor and the second transistor being a field-effect transistor.

9. A liquid ejecting device comprising:
the driver circuit as defined in claim 6; and
an ejection section that includes a piezoelectric element that is displaced upon application of the drive signal, and ejects a liquid upon displacement of the piezoelectric element.

* * * * *